United States Patent [19]

Bickford et al.

[11] Patent Number: 4,937,006
[45] Date of Patent: Jun. 26, 1990

[54] METHOD AND APPARATUS FOR FLUXLESS SOLDER BONDING

[75] Inventors: Harry R. Bickford, Ossining; Raymond R. Horton, Dover Plains; Ismail C. Novan, Peekskill; Michael J. Palmer, Waldon, all of N.Y.; John C. Zyzo, Waterbury, Conn.

[73] Assignee: International Business Machines Corporation, Armonk, N.Y.

[21] Appl. No.: 226,161

[22] Filed: Jul. 29, 1988

[51] Int. Cl.$^5$ ................................ B23K 1/12
[52] U.S. Cl. .......................... 228/219; 228/20
[58] Field of Search ........................ 228/219, 20

[56] References Cited

U.S. PATENT DOCUMENTS

| | | |
|---|---|---|
| 3,617,682 | 11/1971 | Hall . |
| 3,705,457 | 12/1972 | Tardoskegyi .................. 228/219 |
| 3,722,072 | 3/1973 | Beverlein . |
| 3,754,988 | 8/1973 | Bochinski et al. . |
| 3,821,785 | 6/1974 | Rose . |
| 3,868,764 | 3/1975 | Hartleroad et al. . |
| 3,868,765 | 3/1975 | Hartleroad et al. . |
| 3,912,153 | 10/1975 | Hartleroad et al. . |
| 3,937,386 | 2/1976 | Hartleroad et al . |
| 4,096,983 | 6/1978 | Beilein et al. . |
| 4,176,443 | 12/1979 | Iannuzzi et al. . |
| 4,295,596 | 10/1981 | Doten et al. . |
| 4,426,571 | 1/1984 | Beck . |
| 4,465,223 | 8/1984 | Cammarano et al. . |
| 4,552,300 | 11/1985 | Zovko . |
| 4,564,135 | 1/1986 | Barresi et al. . |
| 4,605,152 | 8/1986 | Fridman . |
| 4,606,493 | 8/1986 | Christoph ...................... 228/219 |
| 4,645,116 | 2/1987 | Henrein et al. . |
| 4,646,958 | 8/1987 | Howard, Jr. . |
| 4,648,547 | 3/1987 | Mahler ........................... 228/20 |
| 4,752,025 | 6/1988 | Stach ............................. 228/20 |
| 4,805,827 | 2/1989 | Loffman ........................ 228/20 |
| 4,821,947 | 4/1989 | Nowotarski . |

FOREIGN PATENT DOCUMENTS 55-85037 6/1980 Japan .

OTHER PUBLICATIONS

C. Trollman, "Solder Reflow Tool," IBM Technical Disclosure Bulletin, vol. 11, No. 10, Mar. 1969, p. 1298.

Primary Examiner—Kurt Rowan
Attorney, Agent, or Firm—Daniel P. Morris

[57] ABSTRACT

Method and apparatus for fluxlessly solder bonding a solder mound to a solder wettable surface. A heated gas, preferably a reducing or non-reactive gas, is directed at a solid solder mound. Gas is heated to a temperature sufficient to melt solder mound. The heated gas is directed at the molten solder mound at a momentum sufficient to disperse an oxide layer at the surface of the molten solder mound. Dispersing the oxide layer permits the molten solder to wet the solder wettable surface. The molten solder is cooled to form a solder bond.

22 Claims, 7 Drawing Sheets

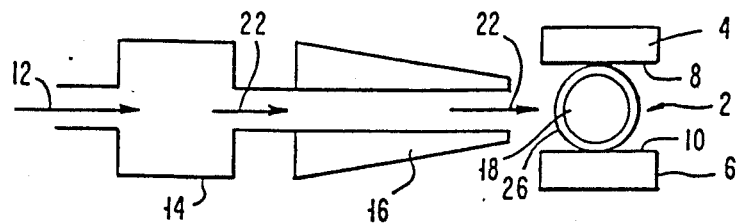
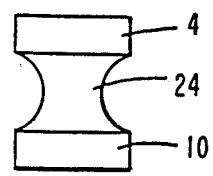
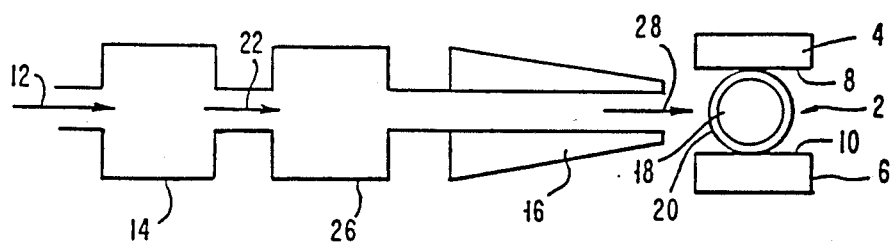
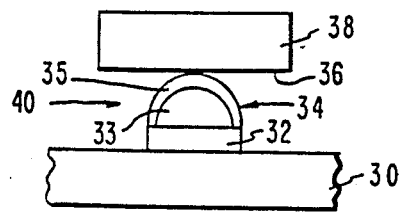
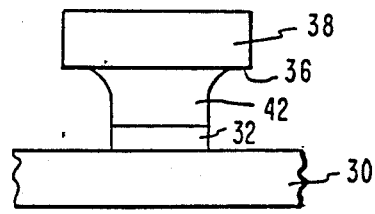

METHOD AND APPARATUS FOR FLUXLESS SOLDER BONDING

I. FIELD OF THE INVENTION

This invention relates to a method and apparatus for fluxless solder bonding, and more particularly, it relates to a method and apparatus for fluxless solder bonding by directing a stream of hot gas sufficiently hot to melt solder and at a sufficiently high momentum to break up the surface oxide on the molten solder.

II. Background of the Invention

Soldering is a common method of joining objects together. Soldering is used to form both physical and electrical connection. It is common practice in solder joining to coat those objects to be joined with chemical flux. Solid solder is then placed between the flux coated objects. The solder is heated to a molten state. The molten solder coats those parts of the objects which have been coated with flux. Thereafter, the molten solder is cooled, forming a physical joint between the two objects. The purpose of the flux is to chemically reduce oxide which is on the surface of the objects to be joined and the oxide on the surface of the molten solder. The oxide which is on the surface of the objects to be joined will prevent molten solder from wetting those surfaces. The oxide on the surface of the molten solder also will prevent the molten solder from wetting the surface of the object to be joined. During the process of heating the solid solder to form a molten mass of solder, the chemical flux volatilizes and is burned off. The volatilization of the flux, however, causes certain undesirable effects. Flux which is not completely removed also has undesirable effects.

As the flux volatilizes the generated gas can become incorporated into the molten solder which, upon cooling, can have voids formed therein from trapped gas. These voids weaken the physical joint of the objects which are soldered together. Furthermore, if the solder joint is forming an electrical connection between the two electrical conductors, the voids decrease the cross-sectional area of the electrical connection, thereby increasing the contact resistance between the two conductors which have been joined.

Flux residue which is not completely volatilized can result in corrosion of solder joints and of the objects which have been joined by the solder joints. This corrosion can increase as a function of time, resulting in further weakening of the physical joint of the two objects joined by the solder. An electrical connection formed by solder joint corrosion due to flux residue can also increase contact resistance over time. Moreover, in the case of an electrical connection formed by the solder joint, voids can move from the interior of the solder joint to the interface of the solder and one of the objects joined because of electromigration effects. If a void is sufficiently large, an electrical opening can result in the solder joint.

In microelectronic application solder bonds are commonly used to form electrical connections, for example, between semiconductor chips and semiconductor chip packaging structures. In one typical application a semiconductor chip is mounted onto a packaging substrate in a flip-chip configuration. In a flip-chip configuration the surface of the semiconductor chip having contact pads thereon is placed facing the surface of a packaging substrate having contact pads thereon. The chip contact pads and the substrate contact pads are electrically connected by solder mounds, commonly referred to as C4s. Typically, the C4 is vacuum deposited onto the chip contact pads. In other typical applications, beam leads or wires are solder bonded to solder coated contact pads on a chip or a packaging substrate. Typically, the solder is vacuum deposited onto either the chip or packaging substrate contact pad.

The general trend in the microelectronics industry is to decrease the size of electrical interconnections to chips and to packaging substrates. Also, the space between contact pads on a chip or a packaging substrate is continually being decreased. Both the decrease in size and space between contact pads on a semiconductor chip or packaging substrate permit a larger number of electrical interconnections to be made between the packaging substrate and the semiconductor chip. Consequently, in a case of a chip mounted onto a packaging substrate in a flip-chip configuration, the C4 interconnections have smaller dimensions and are more closely spaced. Moreover, decreased C4 size results in a smaller space between the semiconductor chip and the packaging substrate. The combination of a smaller space between the chip and the packaging substrate and a smaller space between C4s provides less room for the volatilized flux to escape from between the chips. This situation aggravates the flux residue removal problem for a semiconductor chip mounted in a flip-chip configuration on a packaging substrate. This situation is similar for solder bonding of beam leads or wires to closely spaced contact pads on a semiconductor chip or a packaging substrate. The closely spaced beam leads or wires decrease the space to permit the volatilized flux to escape, and for cleaning flux residue from the regions where the solder joints are to be formed.

As the solder joints in microelectronic applications decrease in size, the undesirable effects, such as voids and corrosion, become more serious. The cross-sectional area of the solder joints are smaller; therefore, the effect of voids on contact resistance increases. Moreover, as the solder joints become smaller they become more susceptible to the adverse effect of corrosion.

It is desirable to be able to form solder joints for microelectronic applications and other applications without the use of chemical flux.

U.S. Pat. No. 4,646,958 to Howard, Jr. describes a fluxless soldering process using a silane atmosphere. Solder reflow or solder chip joining is accomplished in a fluxless system by conducting the solder reflow chip joining procedure in a carrying gas which comprises from about 0.1 to about 10 percent by volume of silane ($SiH_4$). A preferred carrier gas for the reflow is hydrogen, and a preferred carrier gas for the chip joining is nitrogen. The components containing the solder which is to be reflowed, or the semiconductor chip on the substrate to which it is to be joined, are placed within a furnace which is isolated from the external environment. The furnace is then filled with the carrier gas containing silane. The solder is then reflowed or the chip joining process is performed. Howard, Jr. includes silane in the carrier gas to reduce oxides formed on the solder surface, e.g., stanic oxide or lead oxide, back to tin and lead, respectively.

Silane is a highly explosive and toxic gas. It is highly desirable for a large scale manufacturing process to avoid the use of silane. The method of Howard, Jr. requires that the components containing the solder which are to be solder joined be contained within a closed furnace to provide the special atmosphere. This, therefore, requires that the furnace be opened and closed to place the components in the furnace and to remove the components from the furnace.

It is an object of this invention to provide a method of fluxless solder joining without the use of silane.

It is another object of this invention to provide a method of fluxless solder bonding without requiring that the components being solder joined be inclosed in a special atmosphere.

One application of the present invention is in tape automated bonding (TAB) technology. In TAB technology, a spaced series of beam lead sets are fabricated on an elongated flexible carrier film which can be wound onto and unwound from reels for automated fabrication of electronic components. The beam leads at each beam lead set project inwardly towards a central aperture in the flexible film into which they extend in cantilevered fashion. The inner ends of the beam lead which extend into the aperture can be electrically connected to contact pads on a semiconductor chip. The inner ends of the the beam leads can be fluxlessly solder bonded to the chip contact pads according to the methods of this invention. The outer ends of the beam leads extend over additional apertures in the carrier film. The outer ends of the beam leads can be fluxlessly solder bonded to contact pads on a substrate, such as a printed circuit board, by the method according to the present invention. The use of TAB-type tape permits an automated process of forming the inner and outer bonds.

It is another object of this invention to provide an apparatus for fluxlessly forming solder bonds.

In the method and the apparatus according to the present invention, a gas is directed at a solid mound of solder held between the objects to be soldered. The gas is sufficiently heated to melt the solid solder and has a sufficient momentum to disperse the surface oxide formed on the molten solder. The bonding process can be achieved in an oxidizing atmosphere such as atmospheric air.

It is therefor another object of this invention to provide a method and apparatus for fluxlessly solder bonding in an oxidizing environment.

Because, according to this invention, the components being joined do not have to be inclosed within a special environment, an automated process of solder reflow and solder joining of components without the use of flux can be achieved.

The methods generally taught by the following references, all of which are directed to using a heated gas for solder bonding, have not been found to achieve fluxless solder bonding: U.S. Pat. No. 3,912,153, U.S. Pat. No. 4,564,135, U.S. Pat. No. 4,552,300, U.S. Pat. No. 4,295,596, U.S. Pat. No. 4,605,152, U.S. Pat. No. 4,426,511; U.S. Pat. No. 3,754,698, Japanese Patent No. 55-86037 and IBM TDB Vol. 11, No. 10,; March 1969.

III. Summary of the Invention

In its broadest aspect this invention is a method and apparatus for fluxless solder bonding a solder mound to a solder wettable surface. The solder mound is placed against the solder wettable surface. A gas is directed at the solder mound. The gas is heated to a predetermined temperature sufficiently high to melt the solid mound of solder to a molten mass. There is an oxide on the surface of the molten solder. The gas has a sufficient momentum at the point of impact with the oxide to disperse the oxide, permitting the non-oxidized molten solder to wet the solder wettable surface, without requiring flux. The molten solder is cooled forming a solder joint between the solder mound and the solder wettable surface.

In a more particular aspect of the present invention, the heated gas is mixed prior to being directed to the solid mound of solder. The mixed heated gas has a temperature profile sufficient to provide for substantially uniform melting of the solder mound.

These and other objects, features and advantages will be apparent from the following more particular description of the preferred embodiments.

IV. Brief Description of the Drawings

FIG. 1 diagrammatically shows a solder mound held between two objects with a heated gas directed at the solder mounds.

FIG. 2 shows the result of the method of FIG. 1.

FIG. 3 diagrammatically shows the method of FIG. 1 wherein the heated gas is mixed prior to being directed at the solder mound.

FIG. 4 diagrammatically shows an object held against a solder coated contact pad on a substrate with a heated gas directed at the solder coated contact pad.

FIG. 5 shows the result of the method of FIG. 4.

Figure 6:
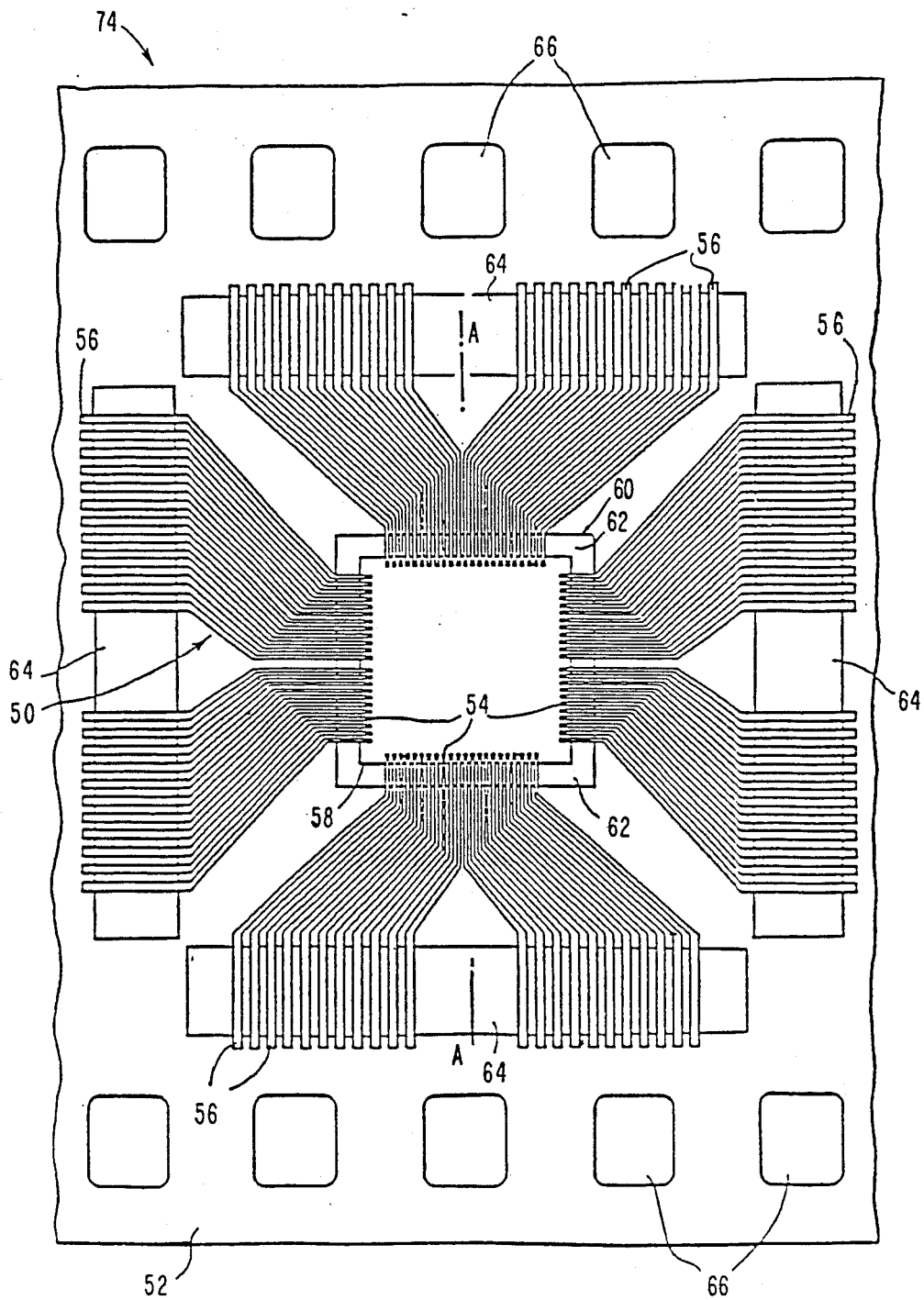
FIG. 6 shows one section of a TAB tape having a plurality of beam leads directed inwardly towards an aperture in the flexible film of the TAB tape, there being an electronic device electrically connected to the inner ends of the beam lead.
Figure 7:
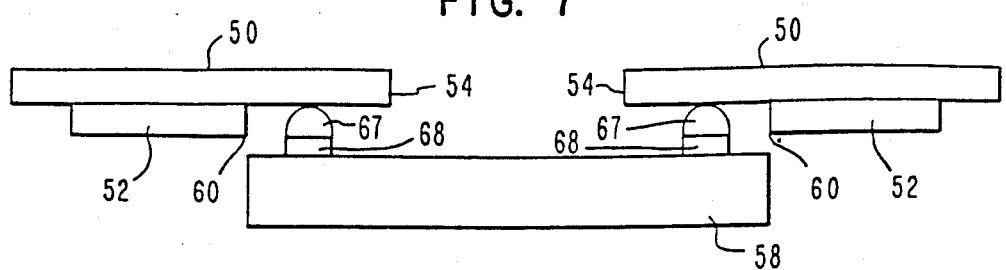

FIG. 7 diagrammatically shows a cross section of the structure in FIG. 6 along line AA.

Figure 8:
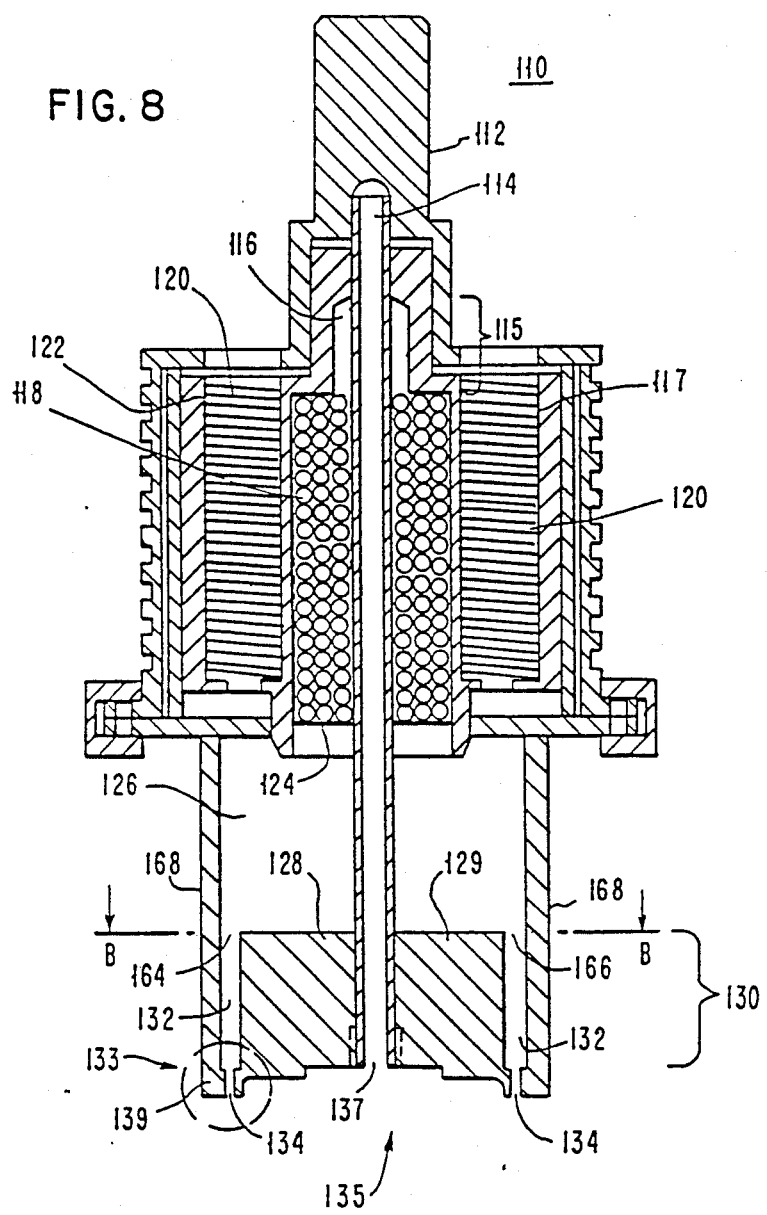

FIG. 8 diagrammatically shows a bonding apparatus according to the present invention.

Figure 9:
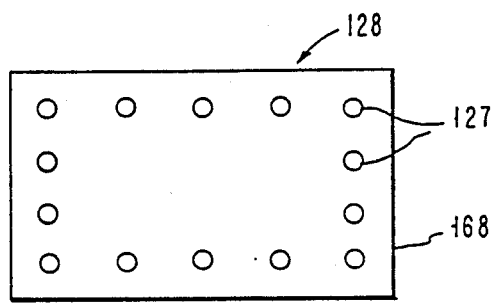
Figure 10:
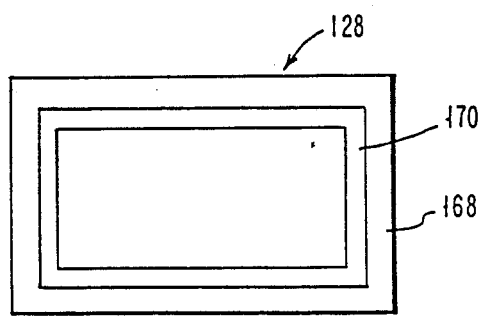

FIG. 9 and FIG. 10 show alternate plan views along line BB of FIG. 8.

Figure 11:
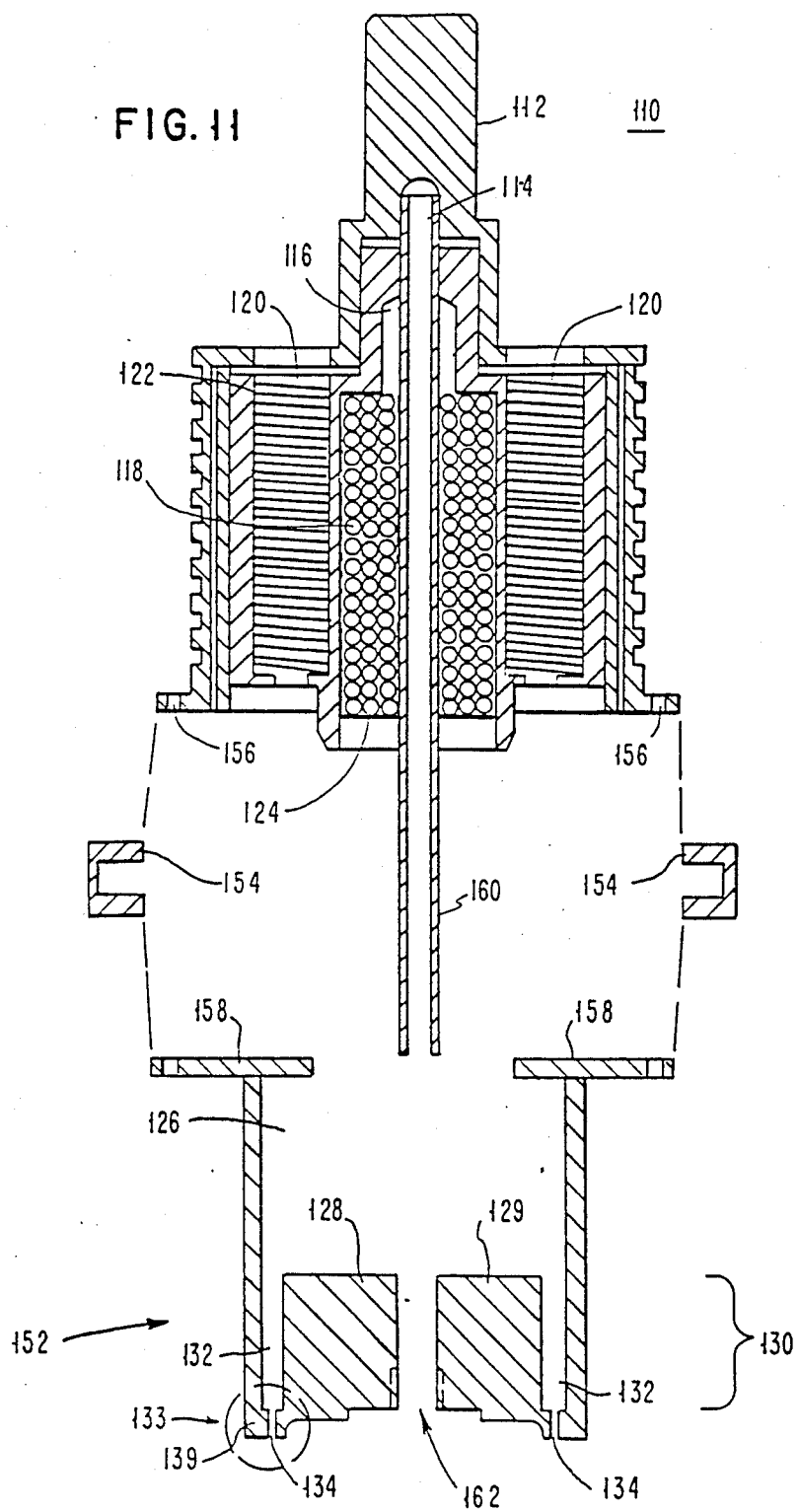

FIG. 11 shows the apparatus of FIG. 8 separated into two major parts.

Figure 12:
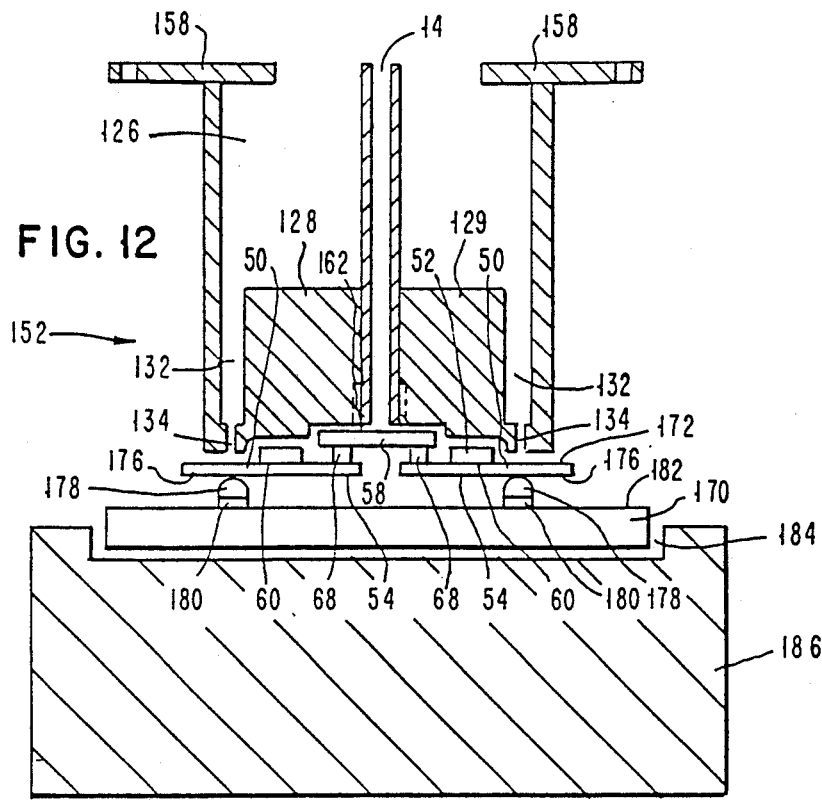

FIG. 12 shows a partial cross section of the apparatus of FIG. 8 performing an outer lead bond.

Figure 13:
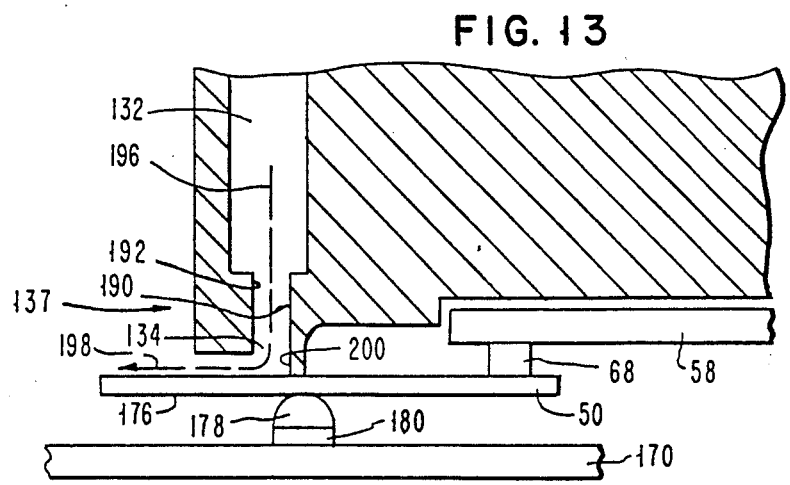

FIG. 13 shows an exploded view partial cross section of the part of the apparatus of FIG. 8 enclosed in the dotted circle in FIG. 8.

Figure 14:
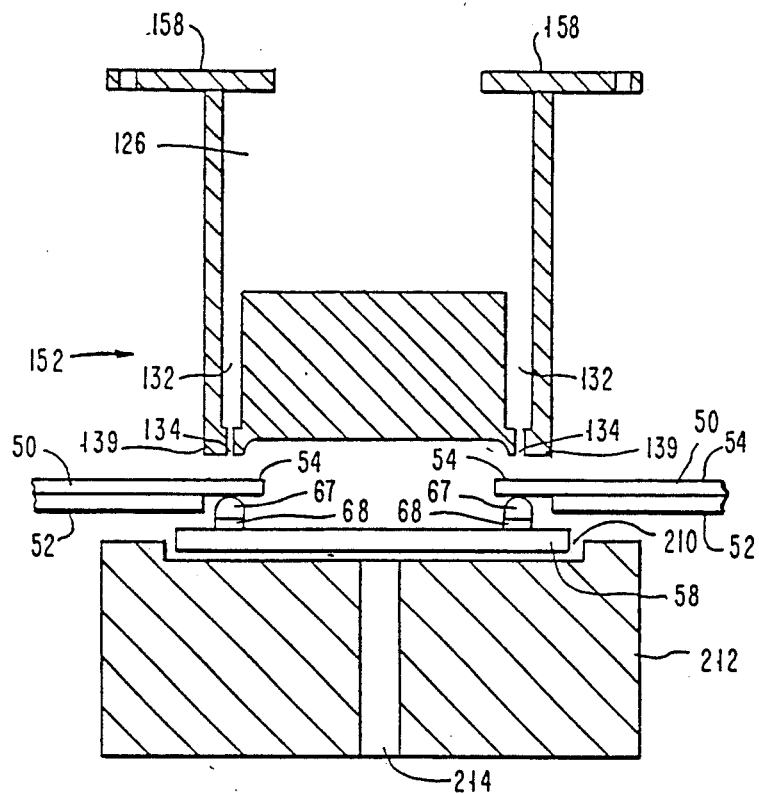

FIG. 14 shows a partial cross section of the apparatus of FIG. 8 performing an inner lead bond.

V. Detailed Description of the Preferred Embodiments

FIG. 1 diagrammatically shows solder mound 2 disposed between object 4 and object 6. Solder mound 2 is in contact with surface 8 of object 4 and surface 10 of object 6. Surfaces 8 and 10 are solder wettable. The solder wettable surfaces can be formed from gold, palladium, platinum, cobalt, silver and gold. This list is exemplary only and not limiting. Gas stream 12 is directed into heater 14 to heat the gas stream 12. The heated gas is directed by nozzle 16 at solder mound 2. Solder mound 2 has an inner core of non-oxidized solder 18 and an outer layer of oxidized solder 20. Solders are generally combinations of lead with other metals such as tin, antimony, indium. Solders are also formed from at least one of the following materials: Cd, Cu, Bi, Zn, Ag, Al, Ga, Au, Hg, Ni, Ge, P and Si. This list is exemplary only and not limiting. The materials which form solder readily oxidize in an oxidizing environment such as atmospheric oxygen. The oxide typically has a thickness of about 0.01 mil to about 0.5 mil. In order to form a solder bond between solder mound 2 and solder wettable surfaces 8 and 10, the surface oxide on the solder mound 2 must be removed. Also, solder wettable surfaces 8 and 10 are free of oxide. Gold, palladium, platinum and cobalt do not form oxide on their surface.

It is common practice in the art, prior to melting solder mound 2, to coat solder mound 2 and surfaces 8 and 10 with flux to chemically reduce any oxide on the solder mound and surfaces. The solid solder is heated to melting. The molten solder with the oxide removed can then wet surfaces 8 and 10.

In FIG. 1 heated gas stream 22 is sufficiently hot to melt solder mound 2. When solder mound 2 melts, the oxide on the solid solder floats on the surface of the molten solder. Gas stream 22 is directed at the molten solder with a sufficiently high momentum which, upon impact with the oxide floating thereon, breaks up and homogenizes the surface oxide within the nonoxidized solder. This permits the nonoxidized molten solder to contact solder wettable surfaces 8 and 10. Quite surprisingly, it has been found that an oxidizing gas, such as atmospheric air, if directed at molten solder mound 2 with a sufficient momentum, breaks up the surface oxide permitting the surfaces 8 and 10 to be wetted by the molten solder. Gas stream 12 is preferably a reducing gas such as a gas containing hydrogen, for example: forming gas which is a mixture of hydrogen and nitrogen (the most preferred combination being 10% $H_2$ and 90% $N_2$); or a non-reactive gas such as a noble gas (for example, argon, neon, helium and the like). Any gas which does not chemically react with the components forming the solder, such as nitrogen, can also be used. The most preferred gas is a gas containing hydrogen. The gas momentum at the oxide surface depends on the gas molecular weight and gas speed at the oxide surface.

After the solder mound 2 is melted and the surface oxide dispersed, the molten solder wets solder wettable surfaces 8 and 10. The structure is then cooled to form the structure shown in FIG. 2, wherein objects 4 and 10 are joined by solder joint 24.

FIG. 3 shows a method similar to that of FIG. 1. All numbers common between FIG. 1, FIG. 2, and FIG. 3 represent the same thing. In FIG. 3 heated gas 22 enters a gas mixer 26. The gas is mixed to provide for a gas stream 28 directed at oxide surface 20, which has a temperature profile distribution which is sufficient to substantially uniformly melt the solder mound 2. The structure formed by the method and apparatus diagrammatically shown in FIG. 3 is shown in FIG. 2.

FIG. 4 shows a substrate 30 and a contact pad 32 thereon. Contact pad 32 is coated with solder mound 34. Solder mound 34 has a nonoxidized center 33 and oxidized surface 35. Solder can be deposited on contact pad 32 by methods such as evaporation, sputter deposition, and the like. Generally, solder is deposited onto pad 32 through a mask so that solder is only deposited onto contact pad 32 and not on other parts of substrate 30. Solder wettable surface 36 of object 38 is placed against solder mound 34. A gas stream 40, in a manner described in reference to FIG. 1 and to FIG. 3, is directed at solder mound 34. Solder mound 34 melts. The surface oxide is dispersed and wets solder wettable surface 36. The molten solder is cooled and solidified. The method diagrammatically shown in FIG. 4 forms a structure shown in FIG. 5. All numbers common between FIG. 4 and FIG. 5 represents the same thing. In FIG. 5, 42 is resolidified solder joining object 32 and object 38.

Methods and apparatus diagrammatically shown in and described with referenced to FIGS. 1 to 5 are generally applicable to soldering any solderable objects together. The melting temperatures of commonly used solders are commonly known in the art.

For convenience the invention will be further described in terms of microelectronic applications. However, the invention is not limited to this application.

In tape automated bonding technology a spaced series of beam lead sets are fabricated on an elongated flexible tape. The flexible tape can be wound onto reels and unwound from the reels for use in an automated process to electrically connect electronic devices to the beam lead sets and to electrically connect the assembly of electronic device and beam lead sets onto a packaging substrate.

FIG. 6 shows one set of beam leads represented by 50 formed on a flexible film 52. Each beam lead has an inner lead bond (ILB) end 54 and an outer lead bond (OLB) end 56. The ILB ends project inwardly towards a central location and are bonded to contact pads on an electronic device represented by 58. For the section 74 of tape, shown in FIG. 6, the ILB ends project inwardly in cantilevered fashion over the edge 60 of aperture 62 in film 52. At the OLB ends, the beam lead projects over apertures 64. Aperture 64 provides an opening in the film 52 to form bonds at the OLB ends. Flexible film 52 has a series of sprocket holes 66 at the outer edges of the film. These sprocket holes permit alignment of the beam lead to contact pads to which both the ILB and the OLB ends will be electrically connected. Generally, the sprocket holes permit only a coarse alignment of the ILB and OLB ends to the contact pads on a chip and substrate, respectively. Commonly used optical systems are used to provide fine alignment of the ILB and OLB ends to contact pads on a chip and substrate, respectively.

FIG. 6 is an example of only one type of metallized carrier for spaced series or groups of beam leads. Another commonly used beam lead carrier has only one layer of metal in which a series of beam lead patterns are formed. The beam leads and the metal film are a unitary structure. The beam leads are formed by etching the beam lead patterns in the tape. Alternatively, the leads may be patterned plated using photolithographic processes.

After a semiconductor chip is bonded to the ILB ends of the beam leads, the leads are severed, by methods commonly used in the art, from the metallized film in the region of the OLB ends in the region of aperture 64 in FIG. 6.

State-of-the-art TAB tape provides beam lead patterns which have ILB end dimension as small as 1 mil with an ILB pitch of 2 mils. Therefore, TAB tape permits fabrication of structures wherein the chips have contact pads having 1 mil dimension with a pad-to-pad pitch of 2 mil.

FIG. 7 is a diagrammatic cross section of FIG. 6 along the line AA of FIG. 6. All numbers common between FIG. 6 and FIG. 7 represent the same thing. FIG. 7 shows contact pad 68 connected to ILB ends 54. Contact pads 68 are not shown in FIG. 6. Contact pads 68 provide electrical connection to the electronic circuits within electronic device 58.

The inner lead bonding tool and the outer lead bonding tools according to this invention are shown in cross section in FIG. 8 as 110. Tool 110 has a housing 112. Housing 112 contains a centrally located vacuum cavity 114 which is physically connected through a port, not shown, to a source of vacuum. Surrounding cavity 114 there is another cavity 116 which is physically isolated from cavity 114. There is a port, not shown in the figure, in 116 for providing an air intake into cavity 116. The lower portion of cavity 116 contains a plurality of particles 118. The particle filled portion of cavity 116 form a gas randomizing chamber. These particles are made from high-heat capacity materials such as stainless steel, nickel, copper, ceramics with high-heat capacity, and the like. This list is examplary only and not limiting. The preferred particles are spherical having a diameter ranging from about 3/32 inch to about 5/32 inch. The particle filled portion of cavity 116 is substantially surrounded by heater 120. Heater 120 can completely surround the lower portion of cavity 116, or only partially surround the lower portion of cavity 116. Heater 120 can be an electrical heating coil, cartridge heater, or any other heaters commonly used in the art. Heater 120 is in cavity 122 in housing 112. Cavity 122 is physically isolated from gas cavity 116 and from vacuum cavity 114. The bottom part of cavity 116 is covered with a diaphragm with apertures therein or a grating 124. Gas randomizing chamber 117 is the bottom portion of cavity 116. Diaphragm or grating 124 separates gas randomizing chamber 117 from gas planarizing chamber 126, and the slits or apertures permit the heated gas to pass from the gas randomizing chamber to the gas planarizing chamber. Slits or apertures in diaphragm or grating 124 are to permit the gas forced into randomizer cavity 116 to enter the gas planarizing chamber 126. Vacuum cavity 114 extends through planarizing chamber 126. The gas entering the cold gas inlet at the top of cavity 116 progresses through randomizing chamber 117. At the outer wall of cavity 116 in the region of heaters 122, heat is exchanged between the heaters and the gas. The gas is heated at the outer periphery of cavity 116. The randomizer 117 shown as particle 118 filled lower part of cavity 116 cause the heated gas at the periphery of cavity 116 to become mixed so that at diaphragm 124 the heat profile of the gas passing over diaphragm 124 is substantially uniform. Gas planarizing chamber 126 permits the cross-sectional area of the gas passing through diaphragm 124 to be either expanded or contracted. Diaphragm 124 separating the gas randomizing chamber 117 from the gas planarizing chamber 126 prevents the particles 118 from falling into gas planarizing chamber 126. At the end of gas planarizing chamber which is opposite to the diaphragm 124 is the gas planarizing chamber terminal end 128 which has either a plurality of apertures 127, as shown in FIG. 9, or a slit 170, as shown in FIG. 10. FIG. 9 and FIG. 10 are exemplary only, variations are apparent to those of skill in the art. End 128 permits containment of the gas rushing past diaphragm 124 in planarizing chamber 126, so that the hot gas entering planarizing chamber 126 is sufficiently mixed so that at end 128 there is a substantially uniform distribution of heated gas. End 128 separates planarizing chamber 126 from bond head 130. At the outer periphery of bond head 130 there is nozzle cavity 132. The nozzle cavity terminates in nozzle tip apertures 134, which can have a cross-sectional area which is less than the cross-sectional area of nozzle cavity 132. FIG. 8 shows the horizontal cross-sectional area of nozzle cavity 132 as rectangular, having a lower portion which has a smaller vertical cross-sectional area. The reduction in vertical cross-sectional area increases the gas velocity exiting aperture 134. This can be achieved by other geometrics, such as by having a triangular or elliptical horizontal cross-sectional area.

Nozzle cavity 132 and nozzle aperture 134 can have any vertical cross-sectional area. Bond head 130 is generally formed from a solid mass of material 129, for example, aluminium. Planarizing chamber terminal end 128 forms one end of bond head 130. Nozzle tip end 135 forms the other end of bond head 130. The nozzle cavity 132 can be a single cavity or a plurality of cavities. The preferred length of planarizing chamber 26 between diaphragm 124 and terminal end 128 is from between about 1.30 inch to about 1.50 inch. This is exemplary only and not limiting. The length generally depends on the soldering application.

The arrangement of nozzle tip apertures 134 in nozzle tip end 135 generally corresponds to the arrangement of apertures in planarizing chamber terminal end 128. The shape and size of nozzle tip apertures 134 are designed to provide gas flow at the desired momentum and direction. If a solder joint is being made between an electronic device and a substrate on which it is to be mounted, the gas nozzles should be parallel to the substrate surface, with an internal turn in the nozzle cavity 132 before reaching gas exit at nozzle tip apertures 134. This situation occurs, for example, when a J lead of a plastic leaded chip carrier is surface mounted to a substrate using solder, or when a semiconductor chip is electrically mounted in a flip-chip configuration on a substrate using solder mounds between the chip and substrate. The nozzle dimensions and distance held from the solder mound, as well as type of gas, gas inlet speed and pressure, determine the gas momentum at the solder mound. It is within the skill of the art to adjust these parameters for a particular application. Vacuum cavity 114 extends through bond head 130 terminating in vacuum part 137 which is used to provide a vacuum pickup.

FIG. 11 shows the same apparatus as shown in FIG. 8. All numbers common between FIG. 11 and FIG. 8 represent the same thing. FIG. 11 shows the apparatus of FIG. 8 separated into two parts 150 and 152. Part 150 contains heating elements 122 and the gas randomizing chamber 117. Part 152 contains the hot gas mixing chamber and the bond head 130. Parts 150 and 152 are held together by clamp 154. Clamp 154 slides over flange 156 on part 150 and flange 158 on part 152 when flange 156 is aligned with and placed against flange 158. Any clamp commonly used in the art can be used to fasten parts 150 and 152 together. The lower portion of vacuum cavity 114, designated as 160 in FIG. 11, is for insertion into cavity 162 in the bond head 130 of part 152. The apparatus diagrammatically shown in FIG. 8 and FIG. 11 is exemplary only. It will be recognized that variations of the apparatus shown in FIG. 8 and FIG. 11 can be made by those skilled in the art.

Part 150 is preferably made of stainless steel. Other materials can be used. At least that part of part 152 in the region of nozzle tip aperture 134 is made of a material which is not wetted by solder, such as, for example, stainless steel, titanium, aluminum and a polymer such as polyimide. If part 152 is made of a polymer, planarizing chamber terminal end 128 is preferably covered with a thermal insulator, such as, for example, a ceramic, to prevent damage to terminal end 128 from the hot gas.

FIG. 9 shows a plan view along the line BB of FIG. 8 in the direction indicated in FIG. 8. In FIG. 9 there are a plurality of circular apertures 127 around the periphery 168 of terminal end 128 of the apparatus shown in FIG. 8. Apertures 127 can have any geometrical shape such as square, rectangle, triangular, and the like. Circular apertures of diameter from about 0.015 inch to about 0.031 inch are most preferred.

FIG. 10 shows alternate embodiments to the structure of FIG. 9. There is a single slit 170 around the periphery 168. The slit can have width from between about 0.015 inch to about 0.031 inch.

FIG. 12 shows the apparatus of FIG. 8 and FIG. 11 used to bond the structure of FIG. 7 to a substrate 170. Numbers common between FIG. 7, FIG. 8, FIG. 11 and FIG. 12 represent the same thing. FIG. 12 only shows part 152 of the apparatus of FIG. 11. Chip 58 is held in well 172 at the base of bond head 130 of part 152. Vacuum is provided through cavity 114, and is applied to the back face of chip 58 at 162. Other vacuum arrangements can be used that do not require the lead frame to be bonded in the chip-up configuration. Nozzle end 139 containing nozzle tip apertures 134 is disposed near outer lead bond end 176 of beam lead 50. Outer lead ends 176 are generally formed prior to bonding. Outer lead ends 176 of beam lead 50 are aligned with solder mounds 178, which are on the surface of contact pad 180. Contact pads 180 are on the surface 182 of substrate 170. Contact pads 180 are electrically connected to conductors in substrate 170, or on the surface 182 of substrate 170. Substrate 170 is held in well 184 of fixture 186. Substrate 170 can be held in place in well 184 by a commonly used vaccum pick-up not shown in FIG. 12. Either fixture 186 is moved towards part 152, or part 152 is moved towards fixture 186. Nozzle ends 139 press beam lead ends 176 against solder mounds 178. Heated gas flows through planarizing chamber 126 down cavity 132 out nozzle tip aperture end 134 to melt solder mounds 178. As described above, gas exits nozzle tip apertures 134 and has a predetermined momentum at the oxide on the solder mound to disperse surface oxide on the surface of the molten solder mound 178. The solder is then cooled by stopping the hot gas flow or flowing cold gas, forming a solder bond between outer lead bond 176 of beam lead 50 and contact pad 180.

FIG. 13 is an exploded view of region 133 enclosed in a dash circle in FIG. 8. Numbers common between FIG. 8 and FIG. 13 represent the same thing. Nozzle tip apertures 134 have side wall 192 and side wall 190. Side wall 190 is longer than side wall 192. The tip 194 of side wall 190, in the bonding operation shown in FIG. 13, presses against the outer lead bond end 176 to press the outer lead bond end 176 against the solder coating 178. Next, hot gas stream 196 is deflected—at the intersection of side wall tip 194 and beam lead end 176—away (as shown by 198) from the electronic device 58. The deflection of the gas stream 196 away from the electronic device 58 can be important if the gas stream has a sufficiently high temperature to damage the electronic device 58 or the electrical connections 68 between beam lead 50 and electronic device 58. A hot gas deflector, such as shown as 200 in FIG. 13, will not always be necessary. If solder mound 178 is 95/5 Pb/Sn solder (which has a melting temperature of about 400° C.) and if electronic device 58 is a gallium arsenide chip, deflecting plate 200 may be necessary.

The structure of FIG. 7 prior to bonding of the inner lead bond ends 54 to contact pads 68 is shown in FIG. 14. Electronic device 58 is disposed in well 210 in fixture 212, which has a vacuum pick-up 214 to hold electronic device 58 in place in well 210. Inner lead bond ends 54 of beam leads 50 are aligned with solder coating 67 on contact pads 68. Commonly used optical alignment systems can be used for this alignment. Nozzle ends 139 are placed against inner lead bond ends 54; just enough pressure is provided to press inner lead bond ends 54 up against solder coating 67. A heated and mixed gas flows down cavity 132 and contacts solder coating 67 at a sufficient temperature and momentum to melt the solder and break up the oxide. The molten solder wets inner lead bond ends 54. The solder is allowed to cool, forming a solder bond between inner lead bond end 54 and contact pads 68. For inner lead bonding the vacuum pick-up provided by cavity 114 in FIG. 8 is not required in FIG. 13. The deflector plate 200 of FIG. 13 can be used in FIG. 14 at nozzle end 139, if desired. To form a bond either nozzle end 139 is moved towards beam leads 54, or the alternative fixture 212 moves chip 58 towards nozzle end 139.

EXAMPLE

The cross-sectional area of the gas inlet to cavity 116 is 0.02 in.$^2$. The cross-sectional area of the top portion 115 of cavity 116 is 0.04 in.$^2$. The length of the top portion 115 of cavity 116 is 0.38 in. The length of gas randomizing chamber 118 is 0.92 in. The cross-sectional area of gas randomizing chamber 118 is 0.20 in.$^2$. The length of planarizing chamber 126 is 1.40 in. The cross-sectional area of the planarizing chamber is 1.50 in.$^2$. The planarizing chamber end 128 is square with 20 circular apertures, as in FIG. 9. Each aperture has area 0.0005 in.$^2$, is spaced apart from each other by 0.02 in. and is spaced from the outer edge of planarizing chamber end 128 by 0.025 in. There are 20 circular nozzle cavities 132 having an upper cross-sectional area 0.001 in.$^2$. The upper length of cavity 132 is 0.125 in. The lower portion of cavity 132 has cross-sectional area 0.0005 in.$^2$ and length 0.110 in. The nozzle tip aperture 134 is held less than 18 mils from the solder mound to which a lead is to be soldered. If hydrogen gas is delivered at 5-7 psi and 3 L/min. and heated to 235°-305° C. in randomizing chamber 118, excellent outer lead bonds, as shown in FIG. 12, are formed with nitrogen, helium, forming gas and compressed air between eutectic solder and Cu, Sn plated Cu, or Au plated Cu leads.

While the invention has been particularly shown and described with reference to preferred embodiments thereof, it will be understood by those of ordinary skill in the art that changes in form and detail may be made therein without departing from the spirit and scope of the invention.

Having thus described our invention what we claim as new and desire to secure Letters Patent is:

1. An apparatus for fluxless solder bonding a solder mound to a solder wettable surface comprising;
    means for holding said solder wettable surface against said solder mound;
    means for heating a gas to a temperature sufficient to melt said solder mound to a molten mass having an oxide on the surface thereof;
    means for directing said gas at said solder mound at a predetermined momentum sufficient to disperse said oxide on the surface of said molten mass;
    a means for randomizing said heated gas and a means for planarizing said randomized gas; and
    means for permitting said molten mass to cool to form a solder bond between said surface and said solder mound.

2. The apparatus of claim 1, wherein said means for randomizing said heated gas consist of a chamber filled with particles of material from about 3/32 inch to about 5/32 inch in size.

3. The apparatus of claim 1, further including a means for deflecting, in a preferred direction, said gas exiting said means for directing said gas at said solder mound.

4. The apparatus of claim 1, wherein said gas is selected from the group consisting of an oxidizing gas, a reducing gas and a nonreactive gas.

5. The apparatus of claim 1, wherein said gas contains hydrogen.

6. The apparatus of claim 1, wherein said solder wettable surface is selected from the group consisting of gold, palladium and platinum.

7. An apparatus for fluxless solder bonding a solder mound to a solder wettable surface comprising:
  means for holding said solder wettable surface against said solder mound;
  gas inlet means connected to a gas randomizing chamber;
  said gas randomizing chamber filled with a plurality of particles for randomizing said gas passing through said randomizing chamber;
  means for heating said gas in said gas randomizing chamber;
  gas planarizing chamber connected to said gas randomizing chamber;
  at least one gas outlet nozzle connected to said gas planarizing chamber;
  means for directing said gas in a predetermined direction at said gas outlet nozzle; and
  means for forcing a gas into said gas inlet means, said forced gas exiting said outlet nozzle contacting said solder mound at a temperature sufficient to melt said solder to a molten mass and at a momentum sufficient to disperse an oxide formed at the surface of said molten solder to permit said molten solder to wet said solder wettable surface.

8. An apparatus comprising;
  means for holding a solder wettable surface against a solder mound;
  means for heating a gas to a temperature sufficient to melt said solder mount to a molten mass having an oxide on the surface thereof;
  means for randomizing said gas;
  means for planarizing said gas; and
  means for directing said gas at said solder mound at a predetermined momentum sufficient to disperse said oxide on said surface of said molten mass, permitting said molten mass to wet said solder wettable surface.

9. The apparatus of claim 8, wherein said means for randomizing said heated gas consist of a chamber filled with particles of material from about 3/32 inch to about 5/32 inch in size.

10. The apparatus of claim 8, further including a means for deflecting, in a preferred direction, said gas exiting said means for directing said gas at said solder mound.

11. The apparatus of claim 8, wherein said gas is selected from the group consisting of an oxidizing gas, a reducing gas and a nonreactive gas.

12. The apparatus of claim 8, wherein said gas contains hydrogen.

13. The apparatus of claim 8, wherein said solder wettable surface is selected from the group consisting of gold, palladium and platinum.

14. A method comprising;
  placing a solder wettable surface against a solder mound;
  heating a gas to a temperature sufficient to melt said solder mound to a molten mass having an oxide on surface thereof;
  randomizing and planarizing said gas; and
  directing said gas at said solder mound at a predetermined momentum sufficient to disperse said oxide on said surface, permitting said molten mass to wet said solder wettable surface.

15. A method for fluxless solder bonding a solder mound to a solder wettable surface comprising;
  holding said solder wettable surface against said solder mound;
  heating a gas to a temperature sufficient to melt said solder mound to a molten mass having an oxide on the surface thereof;
  directing said gas at said solder mound at a predetermined momentum sufficient to disperse said oxide on the surface of said molten mass;
  randomizing said heated gas and planarizing said randomized gas; and
  permitting said molten mass to cool to form a solder bond between said surface and said solder mound.

16. The method of claim 15, wherein said gas is selected from the group consisting of an oxidizing gas, a reducing gas and a nonreactive gas.

17. The method of claim 15, wherein said gas contains hydrogen.

18. The method of claim 15, wherein said solder wettable surface is selected from the group consisting of gold, palladium and platinum.

19. A method comprising;
  holding a solder wettable surface against a solder mound;
  heating a gas to a temperature sufficient to melt said solder mound to a molten mass having an oxide on the surface thereof;
  randomizing said gas;
  planarizing said gas; and
  directing said gas at said solder mound at a predetermined momentum sufficient to disperse said oxide on said surface of said molten mass, permitting said molten mass to wet said solder wettable surface.

20. The method of claim 19, wherein said gas is selected from the group consisting of an oxidizing gas, a reducing gas and a nonreactive gas.

21. The method of claim 20, wherein said gas contains hydrogen.

22. The method of claim 8, wherein said solder wettable surface is selected from the group consisting of gold, palladium and platinum.

* * * * *